United States Patent
Yoon et al.

(10) Patent No.: US 9,632,126 B2
(45) Date of Patent: Apr. 25, 2017

(54) CIRCUIT OF MEASURING LEAKAGE CURRENT IN A SEMICONDUCTOR INTEGRATED CIRCUIT

(71) Applicant: Samsung Electronics Co., Ltd., Suwon-si (KR)

(72) Inventors: Kun-Yong Yoon, Seoul (KR); Jae-Jin Park, Seongnam-si (KR); Ji-Hwan Hyun, Daegu (KR)

(73) Assignee: Samsung Electronics Co., Ltd. (KR)

( * ) Notice: Subject to any disclaimer, the term of this patent is extended or adjusted under 35 U.S.C. 154(b) by 143 days.

(21) Appl. No.: 14/526,849

(22) Filed: Oct. 29, 2014

(65) Prior Publication Data

US 2015/0233996 A1 Aug. 20, 2015

(30) Foreign Application Priority Data

Feb. 14, 2014 (KR) .................. 10-2014-0017351

(51) Int. Cl.
| | | |
|---|---|---|
| G05F 5/00 | (2006.01) | |
| G01R 31/02 | (2006.01) | |
| G01R 31/28 | (2006.01) | |

(52) U.S. Cl.
CPC ....... G01R 31/025 (2013.01); G01R 31/2851 (2013.01)

(58) Field of Classification Search
CPC .................. G01R 31/2851; G01R 31/025
USPC ........................................... 324/509
See application file for complete search history.

(56) References Cited

U.S. PATENT DOCUMENTS

| | | | |
|---|---|---|---|
| 6,844,750 B2 | 1/2005 | Hsu et al. | |
| 7,250,783 B2 | 7/2007 | Hsu et al. | |
| 7,411,409 B2 | 8/2008 | Klass et al. | |
| 8,473,879 B2 | 6/2013 | Joshi et al. | |
| 8,803,591 B1* | 8/2014 | Roy ................ | H03K 19/0027 327/534 |
| 2004/0021505 A1* | 2/2004 | Watanabe ............... | G05F 1/56 327/540 |
| 2005/0275413 A1* | 12/2005 | Arigliano .............. | G01R 27/14 324/549 |
| 2006/0267568 A1* | 11/2006 | Huang .................. | G05F 1/575 323/316 |
| 2007/0145981 A1* | 6/2007 | Tomita ............... | G01R 31/3008 324/509 |
| 2010/0148851 A1* | 6/2010 | Holzmann ........... | H03K 17/063 327/437 |
| 2013/0043889 A1* | 2/2013 | Guo ...................... | G11C 29/02 324/659 |
| 2013/0194122 A1* | 8/2013 | Sarraj .................. | H03F 3/005 341/172 |

(Continued)

FOREIGN PATENT DOCUMENTS

JP 2012042241 3/2012

*Primary Examiner* — Son Le
*Assistant Examiner* — Akm Zakaria
(74) *Attorney, Agent, or Firm* — Onello & Mello, LLP

(57) ABSTRACT

An integrated circuit includes an operational circuit and a test circuit for measuring a leakage current associated with all or part of the operational circuit. The leakage current measurement circuit may include a mirror circuit configured to mirror leakage current to a current-to-voltage converter and an analog-to-digital converter configured to convert the analog voltage representative of the leakage current developed by the current-to-voltage converter to a digital value.

7 Claims, 9 Drawing Sheets

(56) References Cited

U.S. PATENT DOCUMENTS

2013/0207634 A1* 8/2013 Kinoshita ............... G05F 3/02
　　　　　　　　　　　　　　　　　　　　　　　323/313

* cited by examiner

FIG. 5

|  | GATE | DRAIN (SOURCE-P) | SOURCE (DRAIN-P) | BULK | MODE |
|---|---|---|---|---|---|
| NMOS | VFB | GND | GND | - | Ig_on |
| | GND | VFB | GND | - | Id_off |
| | VFB | VDD | GND | VDD | Ig_off |
| PMOS | VDD | VDD | GND | VDD | Is_off |
| | VDD | VDD | GND | VFB | Ib_off |

CIRCUIT OF MEASURING LEAKAGE CURRENT IN A SEMICONDUCTOR INTEGRATED CIRCUIT

CROSS-REFERENCE TO RELATED APPLICATION

This application claims priority under 35 U.S.C. §119 to Korean Patent Application No. 10-2014-0017351 filed on Feb. 14, 2014, the disclosure of which is hereby incorporated by reference in its entirety.

BACKGROUND

Field

Embodiments of the inventive concept relate to a semiconductor integrated circuit, and, particularly, to a circuit of measuring a leakage current flowing through transistors or functional blocks included in the semiconductor integrated circuit.

Description of Related Art

Leakage current of a transistor maybe measured in order to ensure proper performance of a semiconductor integrated circuit. In a system-on-chip (SoC) integrated circuit, leakage current flowing through a transistor in a specific location in the SoC may be measured to ensure that the SoC will operate with sufficient speed without consuming excessive power.

Conventionally, leakage current flowing through transistors in a test chip, rather than that flowing through a real product (that is, an operational chip), has been measured. As a result, conventional measurements of leakage current flowing through transistors or functional blocks may not accurately reflect the leakage current flowing through operational chips (operational, that is, in opposition to test chips).

SUMMARY

In various embodiments of inventive concepts a circuit for measuring a leakage current in a semiconductor integrated circuit includes an operational amplifier configured to receive a reference voltage at a non-inverted input terminal and a feedback voltage at an inverted input terminal connected to a feedback node, and to amplify a difference between the reference voltage and the feedback voltage, a first PMOS transistor having a gate to which an output voltage of the operational amplifier is applied, a source connected to a first supply voltage, and a drain connected to the feedback node, a first switch connected between the feedback node and a circuit block to be tested, a second PMOS transistor having a gate connected to the gate of the first PMOS transistor, and a source connected to the first supply voltage, a resistor connected between a drain of the second PMOS transistor and a ground voltage and an analog-to-digital (A/D) converter configured to perform an A/D conversion on a first voltage signal measured from the resistor to generate output data.

In various embodiments of inventive concepts a circuit for measuring a leakage current includes a reference voltage configured to have a voltage level lower than the first supply voltage.

In various embodiments of inventive concepts a circuit for measuring a leakage current includes a second switch connected between the circuit block to be tested and the ground voltage.

In various embodiments of inventive concepts a circuit for measuring a leakage current includes a circuit block to be tested that includes a first NMOS transistor.

In various embodiments of inventive concepts a circuit for measuring a leakage current includes a second switch connected between the source of the first NMOS transistor and the ground voltage, a third switch having a first terminal connected to a first terminal of the first switch, a second terminal connected to the ground voltage, and a third terminal connected to a gate of the first NMOS transistor, and a fourth switch having a first terminal connected to a first terminal of the first switch, a second terminal connected to the ground voltage, and a third terminal connected to a drain of the first NMOS transistor.

In various embodiments of inventive concepts a circuit for measuring a leakage current a circuit block to be tested includes a third PMOS transistor.

In various embodiments of inventive concepts a circuit for measuring a leakage current includes a second switch connected between the drain of the third PMOS transistor and the ground voltage, a third switch having a first terminal connected to a first terminal of the first switch, a second terminal connected to a second supply voltage, and a third terminal connected to a gate of the third PMOS transistor, a fourth switch having a first terminal connected to the first terminal of the first switch, a second terminal connected to the second supply voltage, and a third terminal connected to a source of the third PMOS transistor, and a fifth switch having a first terminal connected to the first terminal of the first switch, a second terminal connected to the second supply voltage, and a third terminal connected to the bulk of the third PMOS transistor.

In various embodiments of inventive concepts a circuit for measuring a leakage current the circuit block to be tested includes a first NMOS transistor and a third PMOS transistor.

In various embodiments of inventive concepts a circuit for measuring a leakage current includes a second switch connected between a source of the first NMOS transistor and the ground voltage, a third switch having a first terminal connected to a first terminal of the first switch, a second terminal connected to the ground voltage, and a third terminal connected to the gate of the first NMOS transistor, a fourth switch having a first terminal connected to the first terminal of the first switch, a second terminal connected to the ground voltage, and a third terminal connected to the drain of the first NMOS transistor, a fifth switch connected between a drain of the third PMOS transistor and the ground voltage, a sixth switch having a first terminal connected to the first terminal of the first switch, a second terminal connected to a second supply voltage, and a third terminal connected to the gate of the third PMOS transistor, a seventh switch having the first terminal connected to the first terminal of the first switch, a second terminal connected to the second supply voltage, and a third terminal connected to the source of the third PMOS transistor and an eighth switch having a first terminal connected to the first terminal of the first switch, a second terminal connected to the second supply voltage, and a third terminal connected to the bulk of the third PMOS transistor.

In various embodiments of inventive concepts a circuit for measuring a leakage current a gate-on current (Ig_on) of an NMOS transistor is measured with the gate of the first NMOS transistor electrically connected to the feedback node, and the source and drain of the first NMOS transistor electrically connected to the ground voltage.

In various embodiments of inventive concepts a circuit for measuring a leakage current a drain-off current (Id_off) of an NMOS transistor is measured with the gate and source of the first NMOS transistor electrically connected to the ground voltage, and the drain of the first NMOS transistor electrically connected to the feedback node.

In various embodiments of inventive concepts a circuit for measuring a leakage current a gate-off current (Ig_off) of a PMOS transistor is measured with the gate of the third PMOS transistor electrically connected to the feedback node, the source and bulk of the third PMOS transistor electrically connected to the second supply voltage, and the drain of the third PMOS transistor electrically connected to the ground voltage.

In various embodiments of inventive concepts a circuit for measuring a leakage current a source-off current (Is_off) of a PMOS transistor is measured with the gate and bulk of the third PMOS transistor electrically connected to the second supply voltage, the source of the third PMOS transistor electrically connected to the feedback node, and the drain of the third PMOS transistor electrically connected to the ground voltage.

In various embodiments of inventive concepts a circuit for measuring a leakage current a bulk-off current (Ib_off) of a PMOS transistor is measured with the gate and source of the third PMOS transistor electrically connected to the second supply voltage, the bulk of the third PMOS transistor electrically connected to the feedback node, and the drain of the third PMOS transistor electrically connected to the ground voltage.

In various embodiments of inventive concepts a semiconductor integrated circuit includes a circuit block to be tested and a circuit for measuring leakage current from the test block, wherein the circuit for measuring includes an operational amplifier configured to receive a reference voltage at a non-inverted input terminal and a feedback voltage at an inverted input terminal connected to a feedback node, and amplify a difference between the reference voltage and the feedback voltage, a first PMOS transistor having a gate to which an output voltage of the operational amplifier is applied, a source connected to a first supply voltage, and a drain connected to the feedback node, a first switch connected between the feedback node and the circuit block to be tested, a second PMOS transistor having a gate connected to the gate of the first PMOS transistor, and a source connected to the first supply voltage, a resistor connected between a drain of the second PMOS transistor and a ground voltage, and an A/D converter configured to perform an A/D conversion on a first voltage signal measured from the resistor to generate output data.

In various embodiments of inventive concepts a semiconductor integrated circuit includes an operational circuit for which leakage current is to be tested and a leakage current measurement circuit configured to test leakage current of the operational circuit, including a mirror circuit to mirror leakage current to a current-to-voltage converter and an analog-to-digital converter configured to convert the analog voltage representative of the leakage current developed by the current-to-voltage converter to a digital value.

In various embodiments of inventive concepts a semiconductor integrated circuit includes a mirror circuit that includes transistors of different sizes to yield an output current that is a multiple of the leakage current, the multiplying factor being the ratio of sizes of mirror circuit transistors.

In various embodiments of inventive concepts a semiconductor integrated circuit includes a current-to-voltage converter that is a resistor.

In various embodiments of inventive concepts a semiconductor integrated circuit leakage current measurement circuit is switchably connected to the operational circuit for which leakage current is to be tested.

In various embodiments of inventive concepts a semiconductor integrated circuit the multiple of a current mirror is chosen to correlate the input range of the analog-to-digital-converter to the output of the current to voltage converter.

BRIEF DESCRIPTION OF THE DRAWINGS

The foregoing and other features and advantages of inventive concepts will be apparent from the more particular description of embodiments of the inventive concepts, as illustrated in the accompanying drawings in which like reference characters refer to the same parts throughout the different views. The drawings are not necessarily to scale, emphasis instead being placed upon illustrating the principles of the inventive concepts. In the drawings:

FIG. 5 is a table illustrating voltages applied to transistors included in an integrated circuit according to modes of measuring a leakage current;

DESCRIPTION

Figure 1:
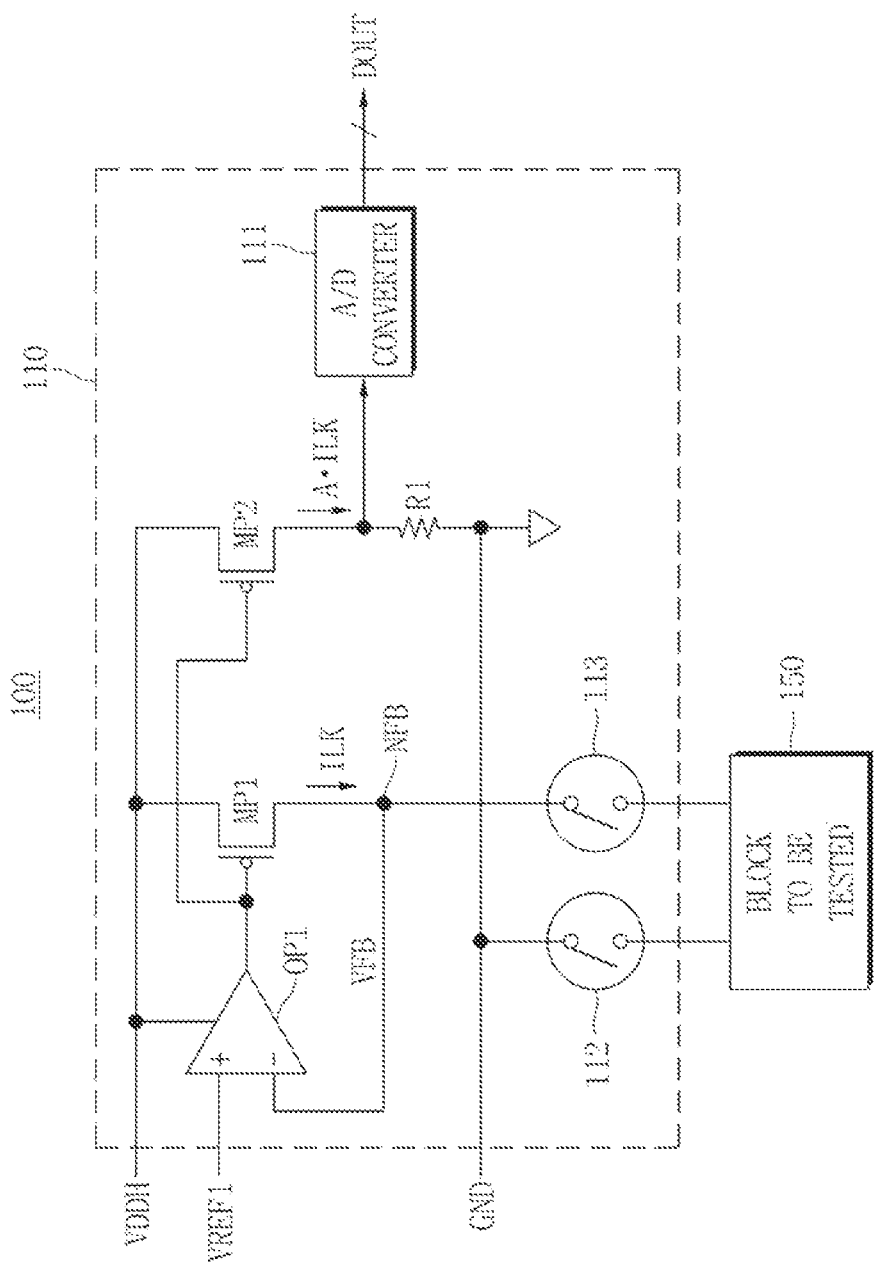
FIG. 1 is a circuit diagram illustrating a semiconductor integrated circuit that includes a circuit for measuring a leakage current according to an embodiment of the inventive concept.

Various exemplary embodiments will be described more fully hereinafter with reference to the accompanying drawings, in which exemplary embodiments are shown. Exemplary embodiments may, however, be embodied in many different forms and should not be construed as limited to exemplary embodiments set forth herein. Rather, these exemplary embodiments are provided so that this disclosure will be thorough, and will convey the scope of exemplary embodiments to those skilled in the art. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. Like numerals refer to like elements throughout. As used herein, the term "and/or" includes any and all combinations of one or more of the associated listed items. The term "or" is used in an inclusive sense unless otherwise indicated.

It will be understood that, although the terms first, second, third, for example. may be used herein to describe various elements, components, regions, layers and/or sections, these elements, components, regions, layers and/or sections should not be limited by these terms. These terms are only used to distinguish one element, component, region, layer or section from another region, layer or section. In this manner, a first element, component, region, layer or section discussed below could be termed a second element, component, region, layer or section without departing from the teachings of exemplary embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. In this manner, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to illustrations that are schematic illustrations of idealized exemplary embodiments (and intermediate structures). As such, variations from the shapes of the illustrations as a result, for example, of manufacturing techniques and/or tolerances, are to be expected. In this manner, exemplary embodiments should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. In this manner, the regions illustrated in the figures are schematic in nature and their shapes are not intended to illustrate the actual shape of a region of a device and are not intended to limit the scope of exemplary embodiments.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. When it is possible to implement any embodiment in any other way, a function or an operation specified in a specific block may be performed differently from a flow specified in a flowchart. For example, two consecutive blocks may actually perform the function or the operation simultaneously, and the two blocks may perform the function or the operation conversely according to a related operation or function.

Inventive concepts will now be described more fully with reference to the accompanying drawings, in which embodiments of inventive concepts are shown.

In exemplary embodiments in accordance with principles of inventive concepts, a semiconductor device may incorporate one or more leakage testing circuits to measure the leakage current of devices, circuits, or functional blocks that are a part of the same device that the testing circuit is a part of. By employing "on-board" leakage current test circuits (that is, leakage current test circuits that are a part of the operational device, rather than a separate device devoted to testing) a system and method in accordance with principles of inventive concepts may improve testing results and reduce requirements for output pads, for example. In exemplary embodiments a leakage current testing circuit may include an amplifier that may be connected through switches to a circuit to be tested and an analog-to-digital converter, configured to measure the circuit's leakage current. Switches may be operated by a self-test circuit or by processor integral to the integrated circuit, for example, to measure various currents. A plurality of such leakage current test circuits may be incorporated in a semiconductor device in accordance with principles of inventive concepts, each dedicated to one or more circuits to be tested. In various configurations test circuits may be configured to test NAND, NOR, or INVERTER circuits, for example. Semiconductor devices in accordance with principles of inventive concepts may be implemented in system-on-chip (SoC) circuits, for example. A leakage current measurement circuit in accordance with principles of inventive concepts may include a mirror circuit configured to mirror leakage current to a current-to-voltage converter (which may be a resistor), and an analog-to-digital converter configured to convert the analog voltage representative of the leakage current developed by the current-to-voltage converter to a digital value. A leakage current measurement circuit in accordance with principles of inventive concepts may be switchably configured to test leakage current during a test mode or to be disconnected from the circuit during an operational mode. The mode in which the leakage current measurement test circuit operates may be controlled by a self-test circuit or processor, for example, that also resides in the operational integrated circuit.

FIG. 1 is a circuit diagram illustrating a semiconductor integrated circuit 100 that includes an exemplary embodiment of a circuit for measuring leakage current in accordance with principles of inventive concepts. Semiconductor integrated circuit 100 may include a block to be tested 150 and a circuit 110 for measuring the leakage current of the block to be tested 150.

The circuit 110 for measuring a leakage current may include an operational amplifier OP1, a first PMOS transistor MP1, a first switch 113, a second PMOS transistor MP2, a resistor R1 and an analog-to-digital (A/D) converter 111.

In exemplary embodiments operational amplifier OP1 receives a reference voltage VREF1 at a non-inverted input terminal and a feedback voltage VFB at an inverted input terminal connected to a feedback node NFB, and amplifies a difference between the reference voltage VREF1 and the feedback voltage VFB. The first PMOS transistor MP1 has a gate to which an output voltage of the operational amplifier OP1 is applied, a source connected to a first supply voltage VDDH, and a drain connected to the feedback node NFB. The first switch 113 is connected between the feedback node NFB and the block to be tested 150. The second PMOS transistor MP2 has a gate connected to the gate of the first PMOS transistor MP1, and a source connected to the first supply voltage VDDH. The resistor R1 is connected between a drain of the second PMOS transistor MP2 and a ground voltage GND. The A/D converter 111 performs an A/D conversion on a first voltage signal measured from the resistor R1 to generate output data DOUT. This digital representation of the measured leakage current may be employed by a semiconductor chip in accordance with principles of inventive concepts as a measure of the chip's, or segment of the chip's, operational efficiency, for example.

In exemplary embodiments circuit 110 for measuring leakage current includes a second switch 112 connected between the block to be tested 150 and the ground voltage GND.

The reference voltage VREF1 may have a voltage level lower than the first supply voltage VDDH. The first supply voltage VDDH may have a voltage level higher than a second supply voltage VDD supplied to the block to be tested 150. In exemplary embodiments, the reference voltage VREF1 may have a voltage level of the second supply voltage VDD. Additionally, the voltage of the feedback node NFB, that is a feedback voltage VFB, may have nearly the same voltage level of the reference voltage VREF1.

The leakage current ILK flowing through the block to be tested 150 flows through the first PMOS transistor MP1, and then flows through the second PMOS transistor MP2 connected to the first PMOS transistor MP1 in a current-mirror form and the resistor R1. That is, because transistors MP1 and MP2 are arranged as a current mirror, the leakage current ILK flowing through transistor MP1 is reflected in transistor MP2. When the size (W/L) of the second PMOS transistor MP2 is A times larger than the first PMOS transistor MP1, a current corresponding to A times of ILK may flow through the second PMOS transistor MP2. That is, leakage current ILK may be multiplied by the size ratio of the first transistor to the second transistor. The A/D converter 111 performs an A/D conversion on the first voltage signal measured from the resistor R1 to generate output data DOUT, a digital representation of leakage current ILK. In this manner, the circuit 110 for measuring a leakage current may measure a leakage current flowing through transistors or functional blocks included in each of semiconductor integrated circuits of a real product (that is, an operational integrated circuit), without requiring separate pads that may be required for testing were a conventional approach to testing, one requiring external test circuits, employed.

Figure 2:
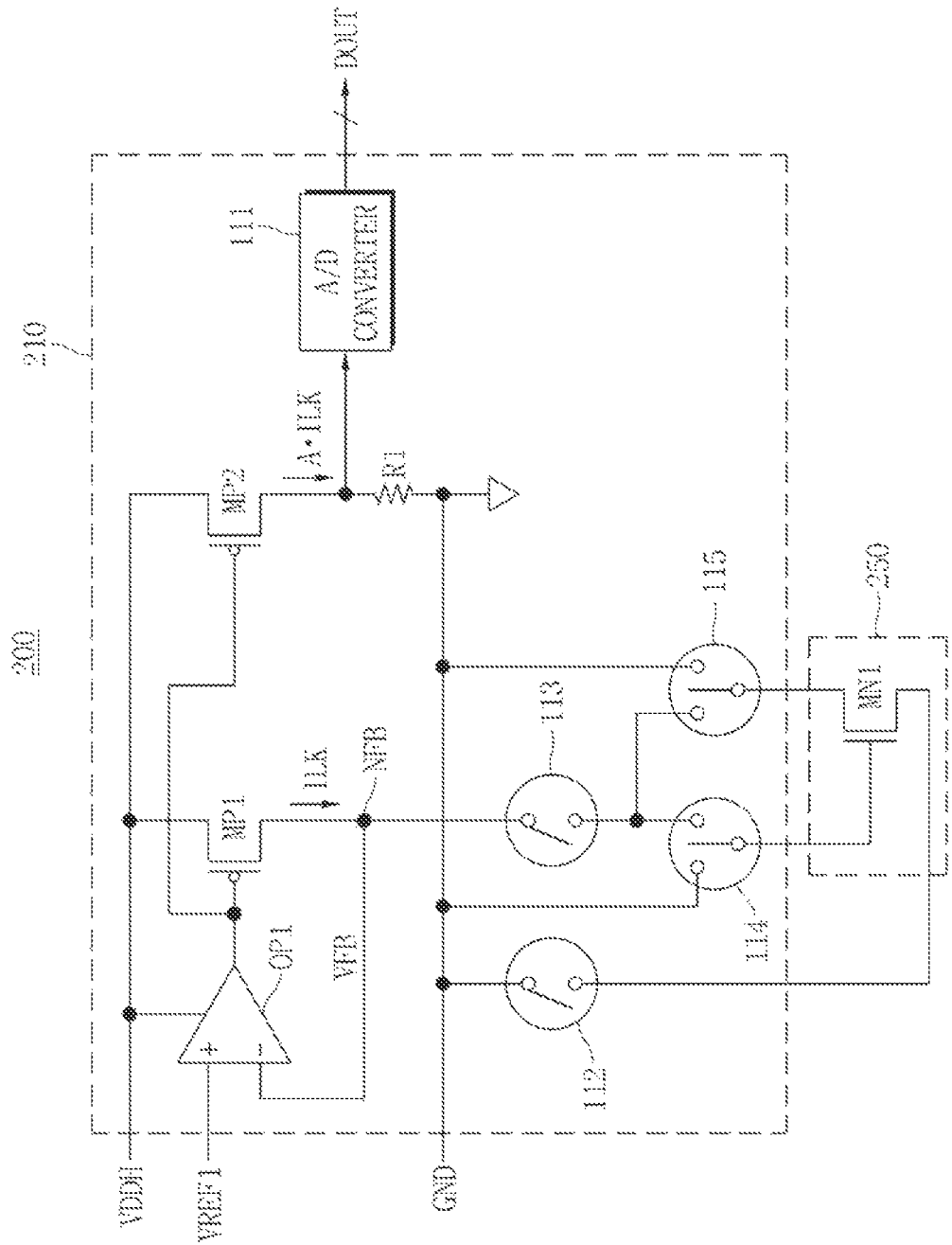
FIG. 2 is a circuit diagram illustrating a semiconductor integrated circuit that includes a circuit for measuring a leakage current according to another embodiment of the inventive concept.

FIG. 2 is a circuit diagram illustrating an exemplary embodiment of a semiconductor integrated circuit 200 that includes a circuit for measuring a leakage in accordance with principles of inventive concepts. Semiconductor integrated circuit 200 may include a block to be tested 250 and a circuit 210 for measuring a leakage current from the block to be tested 250. The block to be tested 250 may include a first NMOS transistor MN1.

The circuit 210 for measuring leakage current may include an operational amplifier OP1, a first PMOS transistor MP1, a first switch 113, a second PMOS transistor MP2, a resistor R1, an A/D converter 111, a second switch 112, a third switch 114 and a fourth switch 115.

In exemplary embodiments second switch 112 is connected between a source of the first NMOS transistor MN1 and the ground voltage GND. The third switch 114 has a first terminal connected to a first terminal of the first switch 113, a second terminal connected to the ground voltage GND, and a third terminal connected to a gate of the first NMOS transistor MN1. The fourth switch 115 has a first tensional connected to a first terminal of the first switch 113, a second terminal connected to the ground voltage GND, and a third terminal connected to a drain of the first NMOS transistor MN1.

In exemplary embodiments, switches 112 through 115 may be operated so that, when gate-on current (Ig_on) of an NMOS transistor is measured, the gate of the first NMOS transistor may be electrically connected to the feedback node NFB, and the source and drain of the first NMOS transistor MN1 may be electrically connected to the ground voltage GND and when drain-off current (Id_off) of an NMOS transistor is measured, the gate and source of the first NMOS transistor MN1 may be electrically connected to the ground voltage GND, and the drain of the first NMOS transistor MN1 may be electrically connected to the feedback node NFB. Operation of current mirror MP1/MP2, operational amplifier OP1, and A/D converter 111 has been described in detail in the discussion related to FIG. 1 and that description will not be repeated here.

Figure 3:
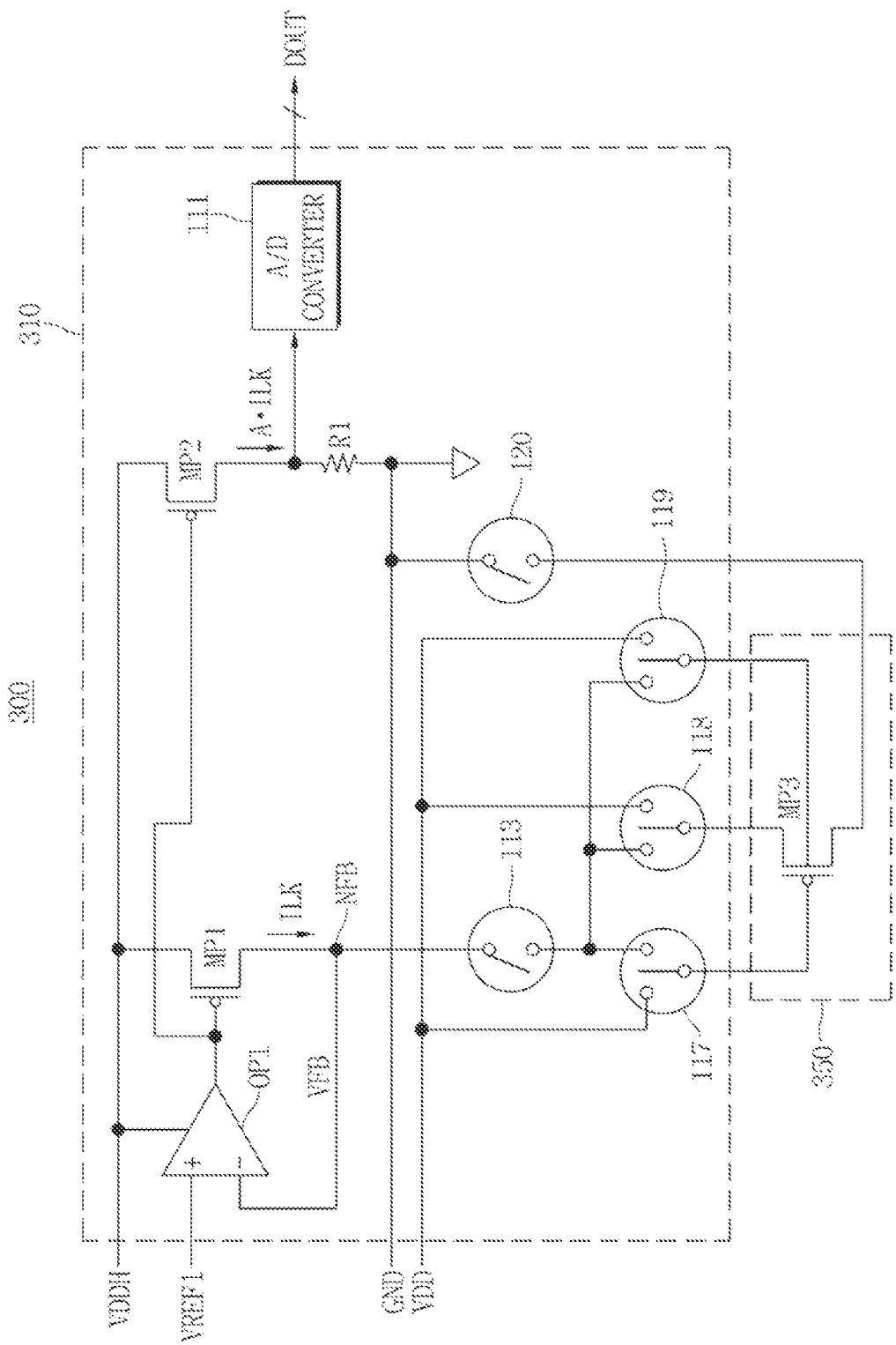
FIG. 3 is a circuit diagram illustrating a semiconductor integrated circuit that includes a circuit for measuring a leakage current according to still another embodiment of the inventive concept.

FIG. 3 is a circuit diagram illustrating an exemplary embodiment of a semiconductor integrated circuit 300 that includes a circuit for measuring a leakage current in accordance with principles of inventive concepts. Semiconductor integrated circuit 300 may include a block to be tested 350 and a circuit 310 for measuring a leakage current associated with the block to be tested 350. The block to be tested 350 may include a third PMOS transistor MP3.

The circuit 310 for measuring a leakage current may include an operational amplifier OP1, a first PMOS transistor MP1, a first switch 113, a second PMOS transistor MP2, a resistor R1, an A/D converter 111, a second switch 120, a third switch 117, a fourth switch 118 and a fifth switch 119.

In exemplary embodiments, second switch 120 is connected between a drain of the third PMOS transistor MP3 and the ground voltage GND. Third switch 117 has a first terminal connected to a first terminal of the first switch 113, a second terminal connected to a second supply voltage VDD, and a third terminal connected to a gate of the third PMOS transistor MP3. The fourth switch 118 has a first terminal connected to the first terminal of the first switch 113, a second terminal connected to the second supply voltage VDD, and a third terminal connected to a source of the third PMOS transistor MP3. The fifth switch 119 has a first terminal connected to the first terminal of the first switch 113, a second terminal connected to the second supply voltage VDD, and a third terminal connected to a bulk of the third PMOS transistor MP3.

In exemplary embodiments switches 113, 117, 118, 119, and 120 may be operated so that, when a gate-off current (Ig_off) of a PMOS transistor is measured, the gate of the third PMOS transistor MP3 may be electrically connected to the feedback node NFB, the source and bulk of the third PMOS transistor MP3 may be electrically connected to the second supply voltage VDD, and the drain of the third PMOS transistor MP3 may be electrically connected to the ground voltage GND. Additionally, when a source-off current (Is_off) of a PMOS transistor is measured, the gate and bulk of the third PMOS transistor MP3 may be electrically connected to the second supply voltage VDD, the source of the third PMOS transistor MP3 may be electrically connected to the feedback node NFB, and the drain of the third PMOS transistor MP3 may be electrically connected to the ground voltage GND. Also, when a bulk-off current (Ig_off) of a PMOS transistor is measured, the gate and source of the third PMOS transistor MP3 may be electrically connected to the second supply voltage VDD, the bulk of the third PMOS transistor MP3 may be electrically connected to the feedback node NFB, and the drain of the third PMOS transistor MP3 may be electrically connected to the ground voltage GND. Operation of current mirror MP1/MP2, operational amplifier OP1, and A/D converter 111 has been described in detail in the discussion related to FIG. 1 and that description will not be repeated here.

Figure 4:
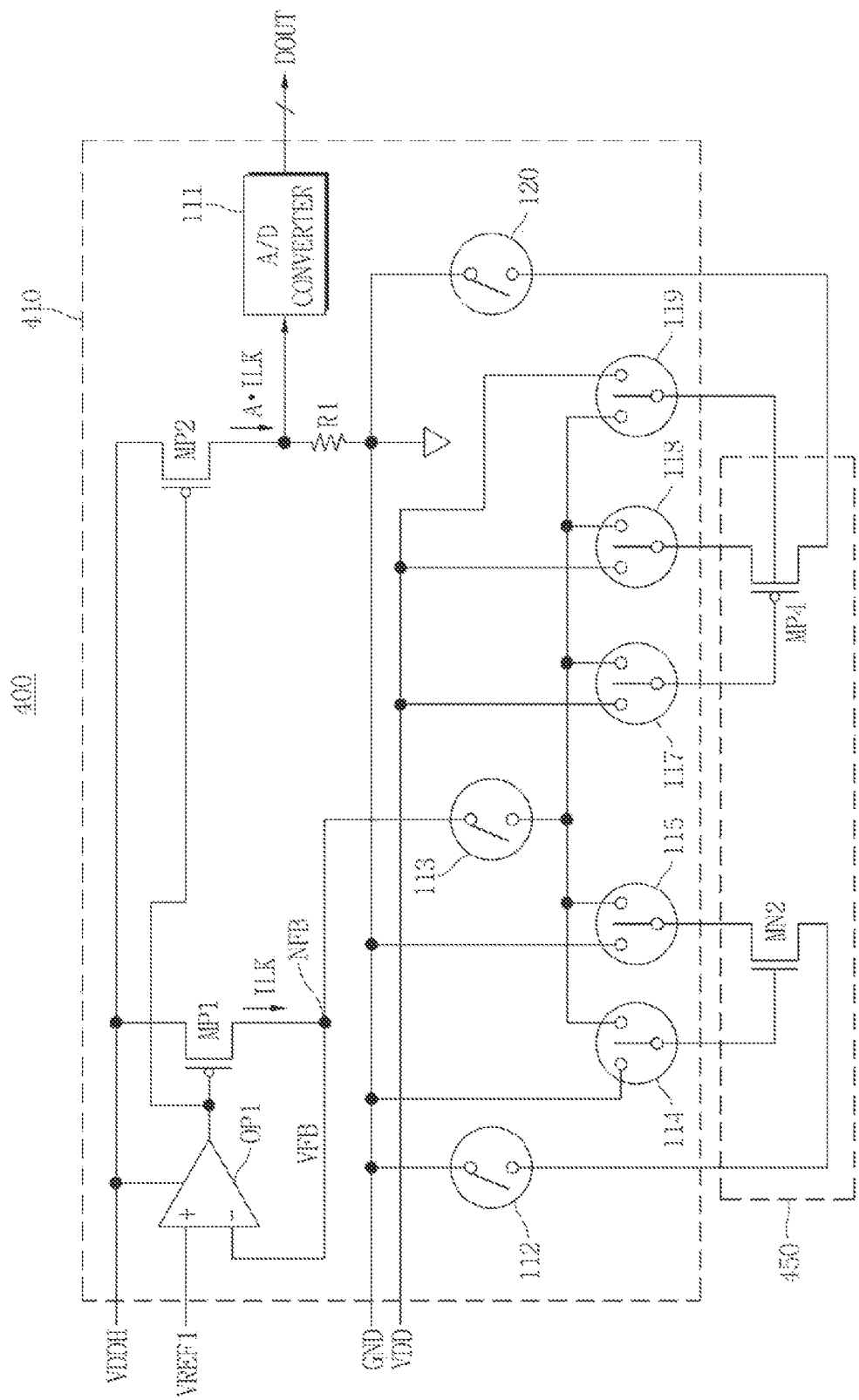
FIG. 4 is a circuit diagram illustrating a semiconductor integrated circuit that includes a circuit for measuring a leakage current according to yet another embodiment of the inventive concept.

FIG. 4 is a circuit diagram illustrating an exemplary embodiment of a semiconductor integrated circuit 400 that includes a circuit for measuring a leakage current in accordance with principles of inventive concepts. Semiconductor integrated circuit 400 may include a block to be tested 450 and a circuit 410 for measuring leakage current associated with the block to be tested 450. The block to be tested 450 may include a second NMOS transistor MN2 and a fourth PMOS transistor MP4.

The circuit 410 for measuring a leakage current may include an operational amplifier OP1, a first PMOS transistor MP1, a first switch 113, a second PMOS transistor MP2, a resistor R1, an A/D converter 111, a second switch 112, a third switch 114, a fourth switch 115, a fifth switch 120, a sixth switch 117, a seventh switch 118 and an eighth switch 119.

The second switch 112 is connected between a source of the second NMOS transistor MN2 and the ground voltage GND. The third switch 114 has a first terminal connected to a first terminal of the first switch 113, a second terminal connected to the ground voltage GND, and a third ten final connected to a gate of the second NMOS transistor MN2. The fourth switch 115 has a first terminal connected to the first terminal of the first switch 113, a second terminal connected to the ground voltage GND, and a third terminal connected to a drain of the second NMOS transistor MN2. The fifth switch 120 is connected between a drain of the fourth PMOS transistor MP4 and the ground voltage GND. The sixth switch 117 has a first terminal connected to the first terminal of the first switch 113, a second terminal connected to a second supply voltage VDD, and a third terminal connected to a gate of the fourth PMOS transistor MP4. The seventh switch 118 has the first terminal connected to the first terminal of the first switch 113, a second terminal connected to the second supply voltage VDD, and a third terminal connected to a source of the third PMOS transistor. The eighth switch 119 has the first terminal connected to the first terminal of the first switch 113, the second terminal connected to the second supply voltage VDD, and a third terminal connected to a bulk of the fourth PMOS transistor MP4.

In exemplary embodiments switches 112, 112, 114, 115, 117, 118, 119, and 120 may be operated so that, when a gate-on current (Ig_on) of an NMOS transistor is measured, the gate of the second NMOS transistor MN2 may be electrically connected to the feedback node NFB, and the source and drain of the second NMOS transistor MN2 may be electrically connected to the ground voltage GND. When a drain-off current (Id_off) of an NMOS transistor is measured, the gate and source of the second NMOS transistor MN2 may be electrically connected to the ground voltage GND, and the drain of the second NMOS transistor MN2 may be electrically connected to the feedback node NFB. Additionally, when a gate-off current (Ig_off) of a PMOS transistor is measured, the gate of the fourth PMOS transistor MP4 may be electrically connected to the feedback node NFB, the source and bulk of the fourth PMOS transistor MP4 may be electrically connected to the second supply voltage VDD, and the drain of the fourth PMOS transistor MP4 may be electrically connected to the ground voltage GND. And when a source-off current (Is_off) of a PMOS transistor is measured, the gate and bulk of the fourth PMOS transistor MP4 may be electrically connected to the second supply voltage VDD, the source of the fourth PMOS transistor MP4 may be electrically connected to the feedback node NFB, and the drain of the fourth PMOS transistor MP4 may be electrically connected to the ground voltage GND. Also, when a bulk-off current (Ib_off) of a PMOS transistor is measured, the gate and source of the fourth PMOS transistor MP4 may be electrically connected to the second supply voltage VDD, the bulk of the fourth PMOS transistor MP4 may be electrically connected to the feedback node NFB, and the drain of the fourth PMOS transistor MP4 may be electrically connected to the ground voltage GND. Operation of current mirror MP1/MP2, operational amplifier OP1, and A/D converter 111 has been described in detail in the discussion related to FIG. 1 and that description will not be repeated here.

FIG. 5 is a table illustrating voltages applied to transistors included in an integrated circuit according to modes of measuring a leakage current in accordance with principles of inventive concepts. As indicated in the table, in the mode in which a gate-on current Ig_on of an NMOS transistor is measured, the feedback voltage VFB may be applied to the gate of the NMOS transistor, and the source and drain of the NMOS transistor may be electrically connected to the ground voltage GND. In the mode in which a drain-off current Id_off of an NMOS transistor is measured, the gate and source of the NMOS transistor may be electrically connected to the ground voltage GND, and the feedback voltage VFB may be applied to the drain of the NMOS transistor.

In the mode in which a gate-off current Ig_off of a PMOS transistor is measured, the feedback voltage VFB may be applied to the gate of the PMOS transistor, the second supply voltage VDD may be applied to the source and bulk of the PMOS transistor, and the drain of the PMOS transistor may be electrically connected to the ground voltage GND. In the mode in which a source-off current Is_off of a PMOS transistor is measured, the second supply voltage VDD may be applied to the gate and bulk of the PMOS transistor, the feedback voltage VFB may be applied to the source of the PMOS transistor, and the drain of the fourth PMOS transistor MP4 may be electrically connected to the ground voltage GND. In the mode in which a bulk-off current Ib_off of a PMOS transistor is measured, the second supply voltage VDD may be applied to the gate and source of the fourth PMOS transistor MP4, the feedback voltage VFB may be applied to the bulk of the PMOS transistor, and the drain of the PMOS transistor may be electrically connected to the ground voltage GND.

Figure 6:
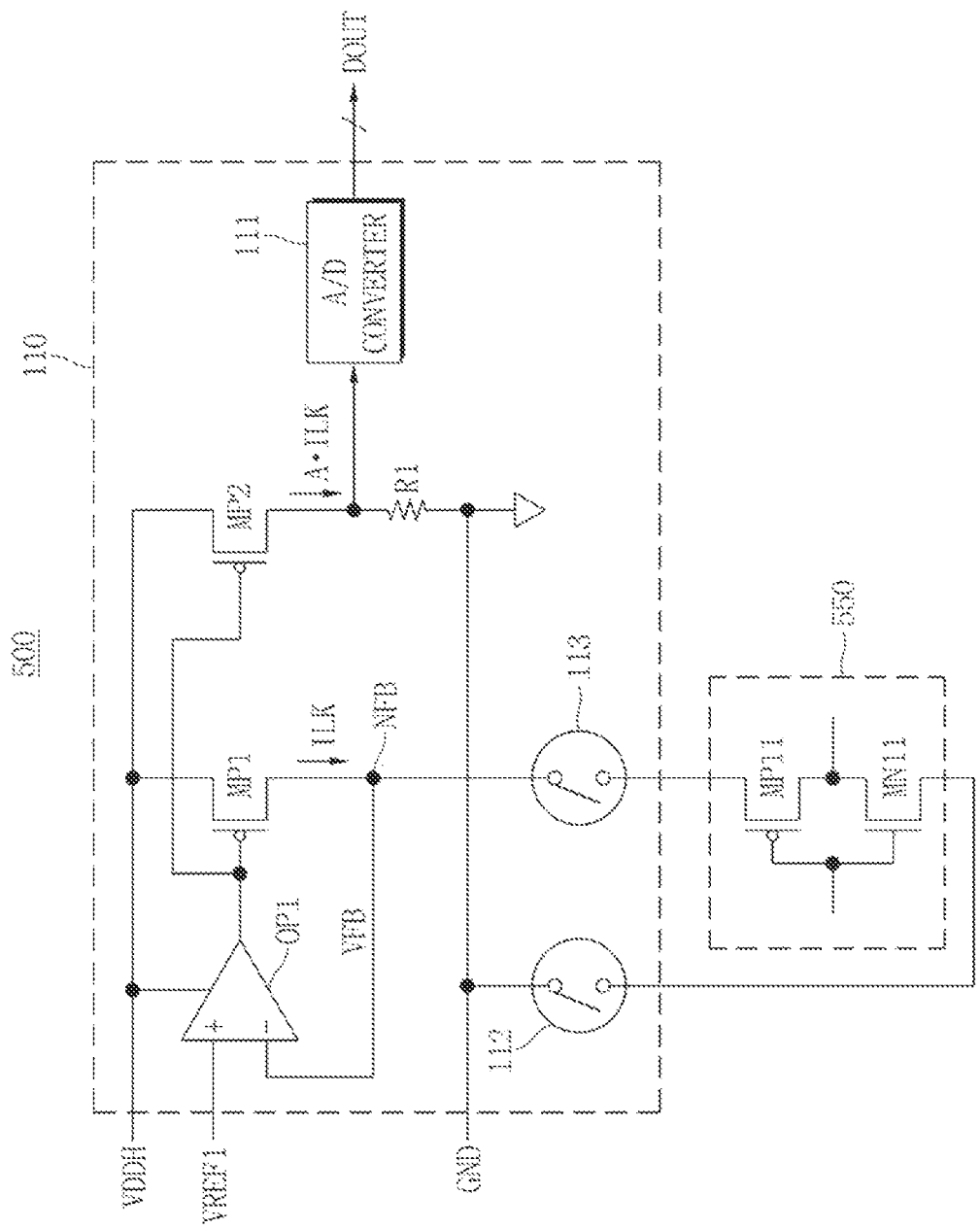
FIG. 6 is a circuit diagram illustrating a semiconductor integrated circuit that includes a circuit for measuring a leakage current according to yet another embodiment of the inventive concept.

FIG. 6 is a circuit diagram illustrating an exemplary embodiment of a semiconductor integrated circuit 500 that includes a circuit for measuring a leakage current in accordance with principles of inventive concepts. Semiconductor integrated circuit 500 may include a block to be tested 550 and a circuit 110 for measuring a leakage current from the block to be tested 550. The circuit 110 for measuring a leakage current in FIG. 6 may have the same configuration as the circuit 110 for measuring a leakage current shown in FIG. 1. The block to be tested 550 may include an inverter that includes a PMOS transistor MP11 and an NMOS transistor MN11. The circuit 110 for measuring a leakage current in FIG. 6 may measure a leakage current flowing through the block to be tested 550 that includes the inverter. Operation of current mirror MP1/MP2, operational amplifier OP1, and A/D converter 111 has been described in detail in the discussion related to FIG. 1 and that description will not be repeated here.

Figure 7:
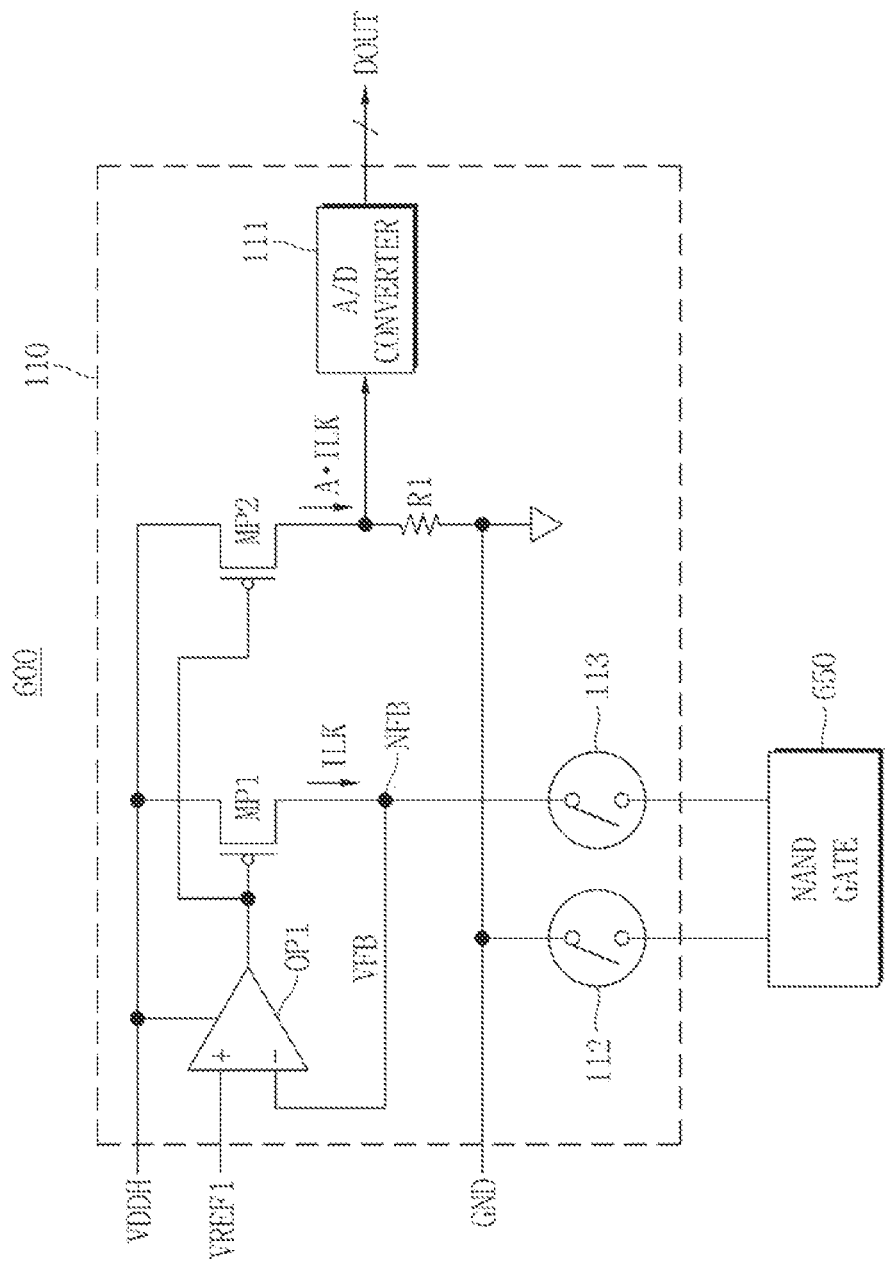
FIG. 7 is a circuit diagram illustrating a semiconductor integrated circuit that includes a circuit for measuring a leakage current according to yet another embodiment of the inventive concept.

FIG. 7 is a circuit diagram illustrating an exemplary embodiment of a semiconductor integrated circuit 600 that includes a circuit for measuring a leakage current in accordance with principles of inventive concepts. Semiconductor integrated circuit 600 may include a block to be tested 650 and a circuit 110 for measuring a leakage current from the block to be tested 650. The circuit 110 for measuring a leakage current in FIG. 7 may have the same configuration as the circuit 110 for measuring a leakage current shown in FIG. 1. The block to be tested 650 may include a NAND gate. The circuit 110 for measuring a leakage current in FIG. 7 may measure a leakage current flowing through the block to be tested 650 that includes the NAND gate. Operation of current mirror MP1/MP2, operational amplifier OP1, and A/D converter 111 has been described in detail in the discussion related to FIG. 1 and that description will not be repeated here.

Figure 8:
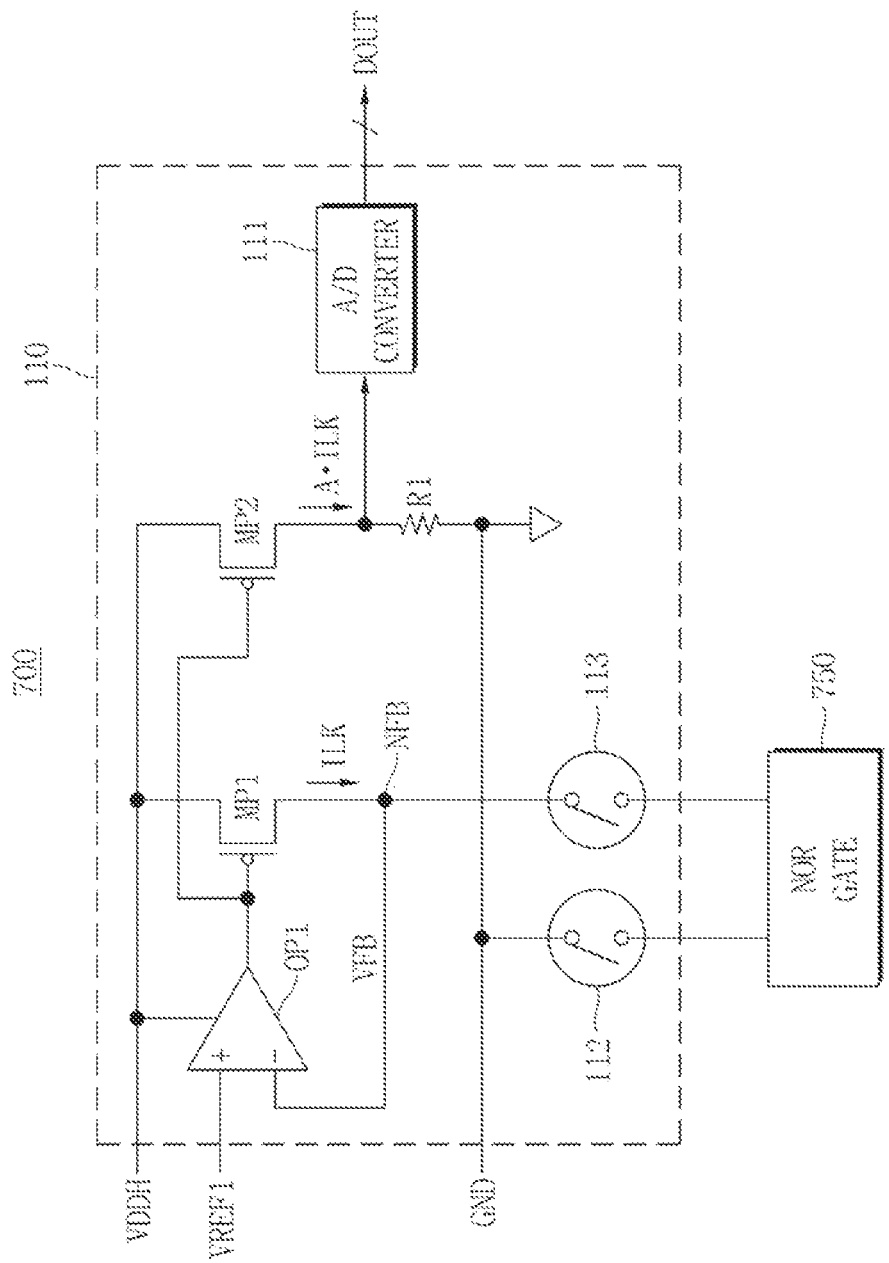
FIG. 8 is a circuit diagram illustrating a semiconductor integrated circuit that includes a circuit for measuring a leakage current according to yet another embodiment of the inventive concept.

FIG. 8 is a circuit diagram illustrating an exemplary embodiment of a semiconductor integrated circuit 700 that includes a circuit for measuring a leakage current in accordance with principles of inventive concepts. Semiconductor integrated circuit 700 may include a block to be tested 750 and a circuit 110 for measuring a leakage current from the block to be tested 750. The circuit 110 for measuring a leakage current in FIG. 8 may have the same configuration as the circuit 110 for measuring a leakage current shown in FIG. 1. The block to be tested 750 may include a NOR gate. The circuit 110 for measuring a leakage current in FIG. 8 may measure a leakage current flowing through the block to be tested 750 that includes the NOR gate. Operation of current mirror MP1/MP2, operational amplifier OP1, and A/D converter 111 has been described in detail in the discussion related to FIG. 1 and that description will not be repeated here.

Figure 9:
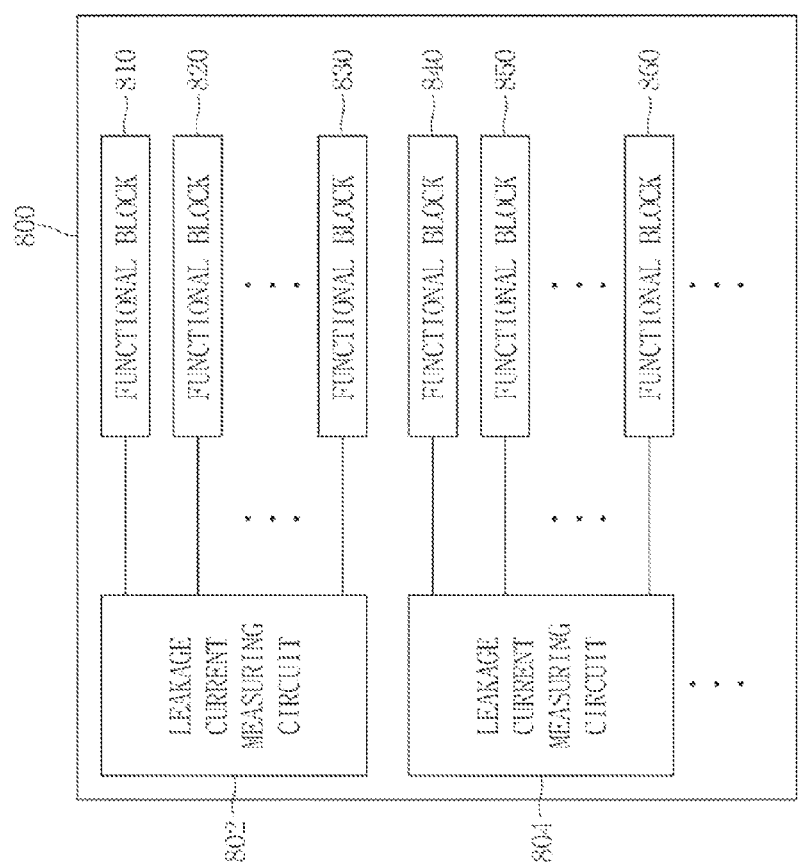
FIG. 9 is a circuit diagram illustrating a semiconductor integrated circuit that includes a circuit for measuring a leakage current according to yet another embodiment of the inventive concept.

FIG. 9 is a circuit diagram illustrating an exemplary embodiment of a semiconductor integrated circuit 800 that includes a circuit for measuring a leakage current in accordance with principles of inventive concepts. Semiconductor integrated circuit 800 may include a plurality of leakage current measuring circuits 802 and 804 and a plurality of functional blocks 810 to 860.

The semiconductor integrated circuit 800 shown in FIG. 9 may measure leakage current flowing through functional blocks 810 to 860 using leakage current measuring circuits 802 and 804 included in the semiconductor integrated circuit 800. Each of the leakage current measuring circuits 802 and 804 may be configured as any of the circuits 110, 210, 310 or 410 for measuring a leakage current according to exemplary embodiments in accordance with principles of inventive concepts and may measure leakage currents flowing through the functional blocks 810 to 860.

A circuit for measuring leakage current from a semiconductor integrated circuit according to embodiments of inventive concepts is able to precisely measure leakage current flowing through transistors or functional blocks included in a semiconductor integrated circuit of a real product (that is, an operational chip, not a test chip). Because the testing takes place "on board" the chip, no additional pads are required for testing. Exemplary embodiments of inventive concepts may be applied to a semiconductor integrated circuit, and particularly, to a system-on-chip (SoC).

The foregoing is illustrative of embodiments and is not to be construed as limiting thereof. Although a few embodiments have been described, those skilled in the art will readily appreciate that many modifications are possible in embodiments without materially departing from the novel teachings and advantages. Accordingly, all such modifications are intended to be included within the scope of inventive concepts as defined in the claims. The foregoing is illustrative of various embodiments and is not to be construed as limited to the specific embodiments disclosed, and that modifications to the disclosed embodiments, as well as other embodiments, are intended to be included within the scope of the appended claims.

What is claimed is:

1. A circuit for measuring a leakage current in a semiconductor integrated circuit, comprising:
   a system on chip (SoC), including a multi-mode self-test circuit, wherein the self-test circuit includes transistor or functional block current leakage measurement circuitry, including:
   an operational amplifier configured to receive a reference voltage at a non-inverted input terminal and a feedback voltage at an inverted input terminal connected to a feedback node, and to amplify a difference between the reference voltage and the feedback voltage;
   a first PMOS transistor having a gate to which an output voltage of the operational amplifier is applied, a source connected to a first supply voltage, and a drain connected to the feedback node;
   a first switch connected between the feedback node and a circuit block to be tested;
   a second PMOS transistor having a gate connected to the gate of the first PMOS transistor, and a source connected to the first supply voltage;
   a resistor connected between a drain of the second PMOS transistor and a ground voltage; and
   an analog-to-digital (A/D) converter configured to perform an A/D conversion on a first voltage signal measured from the resistor to generate output data,
   wherein the circuit block to be tested includes a first NMOS transistor and a third PMOS transistor; and
   further comprising:
   a second switch connected between a source of the first NMOS transistor and the ground voltage;
   a third switch having a first terminal connected to a first terminal of the first switch, a second terminal connected to the ground voltage, and a third terminal connected to a gate of the first NMOS transistor;
   a fourth switch having a first terminal connected to the first terminal of the first switch, a second terminal connected to the ground voltage, and a third terminal connected to a drain of the first NMOS transistor;

a fifth switch connected between a drain of the third PMOS transistor and the ground voltage;

a sixth switch having a first terminal connected to the first terminal of the first switch, a second terminal connected to a second supply voltage, and a third terminal connected to a gate of the third PMOS transistor;

a seventh switch having the first terminal connected to the first terminal of the first switch, a second terminal connected to the second supply voltage, and a third terminal connected to a source of the third PMOS transistor; and an eighth switch having a first terminal connected to the first terminal of the first switch, a second terminal connected to the second supply voltage, and a third terminal connected to a bulk of the third PMOS transistor.

2. The circuit of claim 1, wherein the reference voltage is configured to have a voltage level lower than the first supply voltage.

3. The circuit of claim 1, wherein a gate-on current (Ig_on) of an NMOS transistor is measured with the gate of the first NMOS transistor electrically connected to the feedback node, and the source and drain of the first NMOS transistor electrically connected to the ground voltage.

4. The circuit of claim 1, wherein a drain-off current (Id_off) of an NMOS transistor is measured with the gate and source of the first NMOS transistor electrically connected to the ground voltage, and the drain of the first NMOS transistor electrically connected to the feedback node.

5. The circuit of claim 1, wherein a gate-off current (Ig_off) of a PMOS transistor is measured with the gate of the third PMOS transistor electrically connected to the feedback node, the source and bulk of the third PMOS transistor electrically connected to the second supply voltage, and the drain of the third PMOS transistor electrically connected to the ground voltage.

6. The circuit of claim 1, wherein a source-off current (Is_off) of a PMOS transistor is measured with the gate and bulk of the third PMOS transistor electrically connected to the second supply voltage, the source of the third PMOS transistor electrically connected to the feedback node, and the drain of the third PMOS transistor electrically connected to the ground voltage.

7. The circuit of claim 1, wherein a bulk-off current (Ib_off) of a PMOS transistor is measured with the gate and source of the third PMOS transistor electrically connected to the second supply voltage, the bulk of the third PMOS transistor electrically connected to the feedback node, and the drain of the third PMOS transistor electrically connected to the ground voltage.

* * * * *